(12) United States Patent
Sharma et al.

(10) Patent No.: US 11,949,390 B2
(45) Date of Patent: Apr. 2, 2024

(54) LOAD MODULATED BALANCED POWER AMPLIFIER INTEGRATED CIRCUITS INCLUDING TRANSFORMER-BASED HYBRID SPLITTER/COMBINER CIRCUITS

(71) Applicant: The Trustees of Princeton University, Princeton, NJ (US)

(72) Inventors: Tushar Sharma, Princeton, NJ (US); Chandrakanth Chappidi, Princeton, NJ (US); Zheng Liu, Monmouth Junction, NJ (US); Kaushik Sengupta, Princeton Junction, NJ (US)

(73) Assignee: The Trustees of Princeton University, Princeton, NJ (US)

(*) Notice: Subject to any disclaimer, the term of this patent is extended or adjusted under 35 U.S.C. 154(b) by 655 days.

(21) Appl. No.: 17/150,936

(22) Filed: Jan. 15, 2021

(65) Prior Publication Data

US 2021/0218375 A1    Jul. 15, 2021

Related U.S. Application Data

(60) Provisional application No. 62/961,501, filed on Jan. 15, 2020.

(51) Int. Cl.
*H03F 1/02* (2006.01)
*H03F 3/24* (2006.01)

(52) U.S. Cl.
CPC .......... *H03F 3/245* (2013.01); *H03F 1/0288* (2013.01); *H03F 2200/216* (2013.01); *H03F 2200/534* (2013.01)

(58) Field of Classification Search
CPC .............................. H03F 3/245; H03F 1/0288
See application file for complete search history.

(56) References Cited

U.S. PATENT DOCUMENTS

| | | | |
|---|---|---|---|
| 10,404,224 B2 | 9/2019 | Barton et al. | |
| 10,784,636 B1* | 9/2020 | Vigilante | H04B 1/40 |
| 2015/0091667 A1* | 4/2015 | Seneviratne | H01P 5/02 |
| | | | 333/35 |
| 2016/0218682 A1* | 7/2016 | Lyalin | H03F 3/19 |
| 2019/0165738 A1* | 5/2019 | Pan | H03F 3/604 |
| 2019/0165739 A1* | 5/2019 | Lyalin | H03F 3/19 |

(Continued)

OTHER PUBLICATIONS

Darraji, R. et al., "Mitigation of Bandwidth Limitation in Wireless Doherty Amplifiers With Substantial Bandwidth Enhancement Using Digital Techniques," IEEE Transactions On Microwave Theory And Techniques, vol. 60, No. 9, Sep. 2012, pp. 2875-2885.

(Continued)

*Primary Examiner* — Patricia T Nguyen
(74) *Attorney, Agent, or Firm* — Stanek Lemon Crouse & Meeks, P.A.

(57) ABSTRACT

A load modulated balanced amplifier (LMBA) circuit can include an input pad of the LMBA circuit configured to receive an input signal on a semiconductor die. A transformer-based hybrid splitter can be coupled to the input pad and configured to provide a first split input signal and a second split input signal from the input signal. A control power amplifier circuit coupled the first split input signal and a power amplifier circuit coupled to the second split input signal.

12 Claims, 11 Drawing Sheets

(56) References Cited

U.S. PATENT DOCUMENTS

2020/0112287 A1* 4/2020 Pham ..................... H03F 3/195

OTHER PUBLICATIONS

Hu, Song et al., "A 28GHz/37GHz/39GHz Multiband Linear Doherty Power Amplifier for 5G Massive MIMO Applications," IEEE International Solid-State Circuits Conference (2017), Session 2/Power Amplifiers/2.1, pp. 32-34.
Quaglia, Roberto et al., "A Load Modulated Balanced Amplifier for Telecom Applications," IEEE Transactions On Microwave Theory And Techniques, vol. 66, No. 3, Mar. 2018, pp. 1328-1338.
Shakib, Sharif et al., "A Wideband 28GHz Power Amplifier Supporting 8x100MHz Carrier Aggregation for 5G in 40nm CMOS," IEEE International Solid-State Circuits Conference (2017), Session 2/Power Amplifiers/2.7, p. 44-.
Wang, Fei et al., "A Highly Linear Super-Resolution Mixed-Signal Doherty Power Amplifier for High-Efficiency mm-Wave 5G Multi-Ghz Communications," IEEE International Solid-State Circuits Conference (2019), Session 4/Power Amplifiers/4.8, pp. 88-90.

* cited by examiner

| | THIS WORK | T.L RFIC'18 | S.HU ISCC'17 | M. VIGILANTE RFIC'17 | S.SHAKIB ISSCC'17 | P. INDIRAYANTI RFIC'17 |
|---|---|---|---|---|---|---|
| FREQUENCY OF OPERATION (GHz) | 30-40 | 23.5-41 | 26-44 | 29-57 | 27 | 32 |
| TECHNOLOGY | 65NM BULK CMOS | 45NM CMOS SOI | 0.13μM SIGE | 28NM BULK CMOS | 40NM BULK CMOS | 28NM BULK CMOS |
| ARCHITECTURE | LMBA (LOAD MODULATED BALANCED AMPLIFIER) | HYBRID OF CONTINUOUS CLASS F/F$^{-1}$ | MULTIBAND DOHERTY | BROADBAND SERIES POWER COMBINER | 3 STAGE DIFFERENTIAL PA | ANALOG DOHERTY |
| SUPPLY (V) $P_{SAT}$ (DBM) | 1.1 20 @33G | - 18.6@28G | 1.5 17.1@37G | 0.9 16.6@30G | 1.1 15.1 | 1 19.8 |
| $\eta_{OUT}$(-4DB PBO) / $\eta_{OUT}$ (PK) | 0.61@33G | 0.54*@28G | 0.9*@37G | - | 0.5(PAE) | 0.57(PAE) |
| PEAK $\eta_{OUT}$ (%) | 38.3 @33G | 55*@28G | 27.6@37G | 33.7(PAE) | 33.7(PAE) | 21(PAE) |
| PEAK $\eta_{OUT}$ AT 4DB BACK-OFF (%) | 23.3 @33G | 30*@28G | 25*@37G | 17(PAE) | 17(PAE) | 12(PAE)* |
| PEAK PAE (%) | 23.3@33G | 45.7@28G | 22.6@37G | 24.2@30G | 33.7 | 21 |
| MODULATION/ DATA/RATE/ $P_{OUT,AVG}$/ $\eta_{OUT,AVG}$ | 64QAM/5GBPS/ 10.6D3M/121%@33G | - | 64QAM/ 6GBPS/ 7.2DBM/ 14.4%@37G | 64QAM/ 6GBPS/ 5.9DBM/ >2.3% @34G | 64QAM/ OFDM 8-CC/6.7DBM/11%(PAE) | 64QAM/ 15GBPS/ 11.7DBM/5.75% (PAE) |
| ACLR (DBC) | -29 @10.6 DBM @33G | - | -25.4 @7.2DBM @37G | -36.9 @5.9DBM | -29.4 @6.7DBM | - |
| EVM (DB) | -25.4 @10 DBM @33G | - | -26.6 @7.2DBM @37G | -25 @5.9DBM | -25 @6.7DBM | -25 @11.7'DBM |
| INTEGRATION LEVEL | FULLY ANALOG | FULLY ANALOG | FULLY ANALOG | FULLY ANALOG | FULLY ANALOG | FULLY ANALOG |
| AREA (MM$^2$) | 1.47 | 0.14** | 1.76 | 0.16** | 0.225** | 0.59 |

FIG. 13

LOAD MODULATED BALANCED POWER AMPLIFIER INTEGRATED CIRCUITS INCLUDING TRANSFORMER-BASED HYBRID SPLITTER/COMBINER CIRCUITS

CLAIM FOR PRIORITY

The present application claims priority to U.S. Provisional Application Ser. No. 62/961,501, entitled Integrated Load Modulated Balanced Power Amplifier filed in the U.S.P.T.O on Jan. 15, 2020, the entire disclosure of which is hereby incorporated herein by reference.

FIELD

The present invention relates to the field of electronics in general, and more particularly, to wireless communications.

BACKGROUND

Fifth-generation (5G) communication systems promise higher data rates and quality of service to support advanced modulation schemes. The 5G new radio (NR) has laid out different mmWave bands with 28-40 GHz frequency of operation as primary frequency band. These new front-end systems at mm Wave pose unique design challenges in terms of achievable peak and back-off efficiencies and linearity across a wide spectrum. Conventionally, ClassA/AB bias Power Amplifiers (PA) can show very low efficiency at back-off, while load modulation techniques have been explored as combining architectures with efficiency enhancement with a relatively narrower bandwidth. While the bandwidth can be enhanced with transformer-based power combining and frequency-dependent load-modulation with mmWave DACs, this often comes at the expense of linearity and complex high-speed DSP.

In addition to enhancement of bandwidth and back-off efficiency, the linearity consideration may be particularly important since complex digital pre-distortion operating with Gbps links can be very power hungry and challenging to integrate. Within the class of power combining, load modulation architecture based on balanced amplifier structure has been untapped at mmWave frequencies. For an efficient power combining over a wide bandwidth, a balanced amplifier may be used wherein two amplifying devices run in quadrature i.e. operating 90 degrees apart in transmission phase. However, the balanced PA may not exhibit any load modulation or mutual load pulling as both devices operate under bias condition.

A balanced amplifier uses the classical quadrature hybrid wherein the two PAs combine through two ports that are isolated with respect to each other. The signals cancel in the isolated port that is terminated with a resistive loading to support balanced operation, delivering the combined power into the desired load. This isolation of the output port can be exploited to inject a control signal with varying amplitude and phase to load modulate the individual Balanced PAs (BPA) which experience the same load modulation. A control PA (CPA) actively synthesizes any targeted impedance at the balanced PA output depending on the power or amplitude and phase of the injected signal. The variation of amplitude changes the load impedance as a function of power which can provide back-off reconfigurability while the phase moves impedance on a constant VSWR circle. Through simultaneous control of amplitude and phase both the BPAs can be matched to a 2D plane on a Smith Chart that is necessary of simultaneous wideband and power back-off efficient operation.

SUMMARY

Embodiments according to the present invention can provide load modulated balanced power amplifier integrated circuits including transformer-based hybrid splitter/combiner circuits. Pursuant to these embodiments, a load modulated balanced amplifier (LMBA) circuit can include an input pad of the LMBA circuit configured to receive an input signal on a semiconductor die. A transformer-based hybrid splitter can be coupled to the input pad and configured to provide a first split input signal and a second split input signal from the input signal. A control power amplifier circuit coupled the first split input signal and a power amplifier circuit coupled to the second split input signal.

In some embodiments according to the invention, a load modulated balanced amplifier (LMBA) circuit can include an input pad of the LMBA circuit configured to receive an input signal on a semiconductor die. A phase compensation circuit splitter can be coupled to the input pad and configured to provide a first split input signal and a second split input signal from the input signal. A control power amplifier circuit coupled the first split input signal and a power amplifier circuit coupled to the second split input signal.

A load modulated balanced amplifier (LMBA) circuit can include an input pad of the LMBA circuit configured to receive an input signal on a semiconductor die. A lumped equivalent hybrid splitter can be coupled to the input pad and configured to provide a first split input signal and a second split input signal from the input signal. A control power amplifier circuit can be coupled the first split input signal and a power amplifier circuit can be coupled to the second split input signal.

BRIEF DESCRIPTION OF THE DRAWINGS

FIG. 13 is a table showing the performance characteristics of an example embodiment according to the invention table in comparison to conventional fully integrated RFin–RFout mmWave silicon PAs.

DETAILED DESCRIPTION OF EMBODIMENTS ACCORDING TO THE INVENTION

Exemplary embodiments of the present disclosure are described in detail with reference to the accompanying drawings. The disclosure may, however, be exemplified in many different forms and should not be construed as being limited to the specific exemplary embodiments set forth herein. Rather, these exemplary embodiments are provided so that this disclosure will be thorough and complete, and will fully convey the scope of the disclosure to those skilled in the art.

Figure 1:
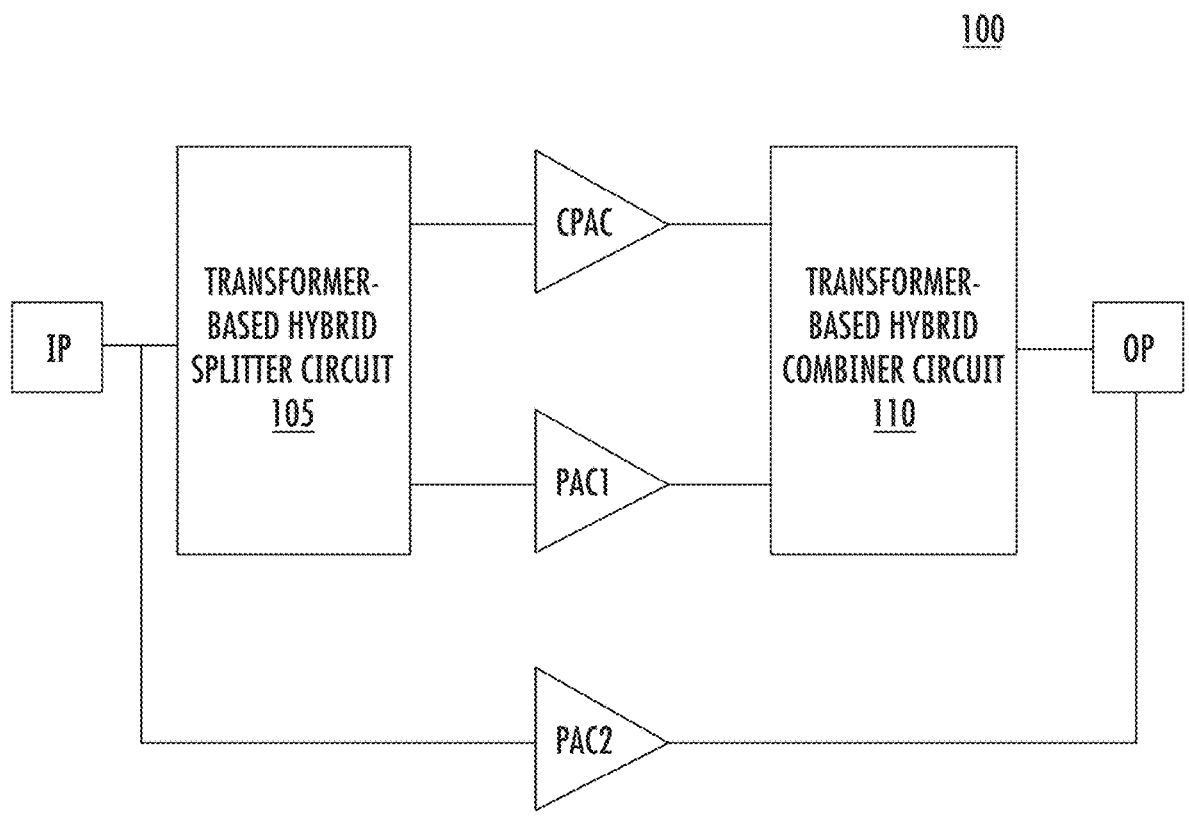
FIG. 1 is a block diagram showing a Load Modulated Balanced Amplifier (LMBA) circuit including transformer-based hybrid circuits providing an input splitter circuit at an input and a combiner circuit at an output of the LMBA circuit in some embodiments according to the invention.

FIG. 1 is a block diagram showing a Load Modulated Balanced Amplifier (LMBA) circuit 100 including transformer-based hybrid circuits providing an input splitter circuit 105 coupled to an input pad IN and a combiner circuit 110 coupled to an output pad OUT of the LMBA circuit 100 in some embodiments according to the invention. In particular, the input splitter circuit 105 is configured to split the input signal received via the input pad into a first split input signal and a second split input signal. The first split input signal is provided to an input of a control power amplifier circuit CPAC which provides an output signal to a first input of the combiner circuit 110. The second split input signal is provided to an input of a first the power amplifier circuit PAC1 which provides an output signal that is coupled to a second input of the combiner circuit 110. The combiner circuit 110 is a transformer-based hybrid circuit that is configured to combine the signals output by the CPAC and the PAC1 to generate an output signal that is coupled to the output pad OUT. The input signal is also provided to the input of a second power amplifier circuit PAC2 which generates an output signal that is coupled to the output signal generated by the combiner circuit 110.

Figure 2:
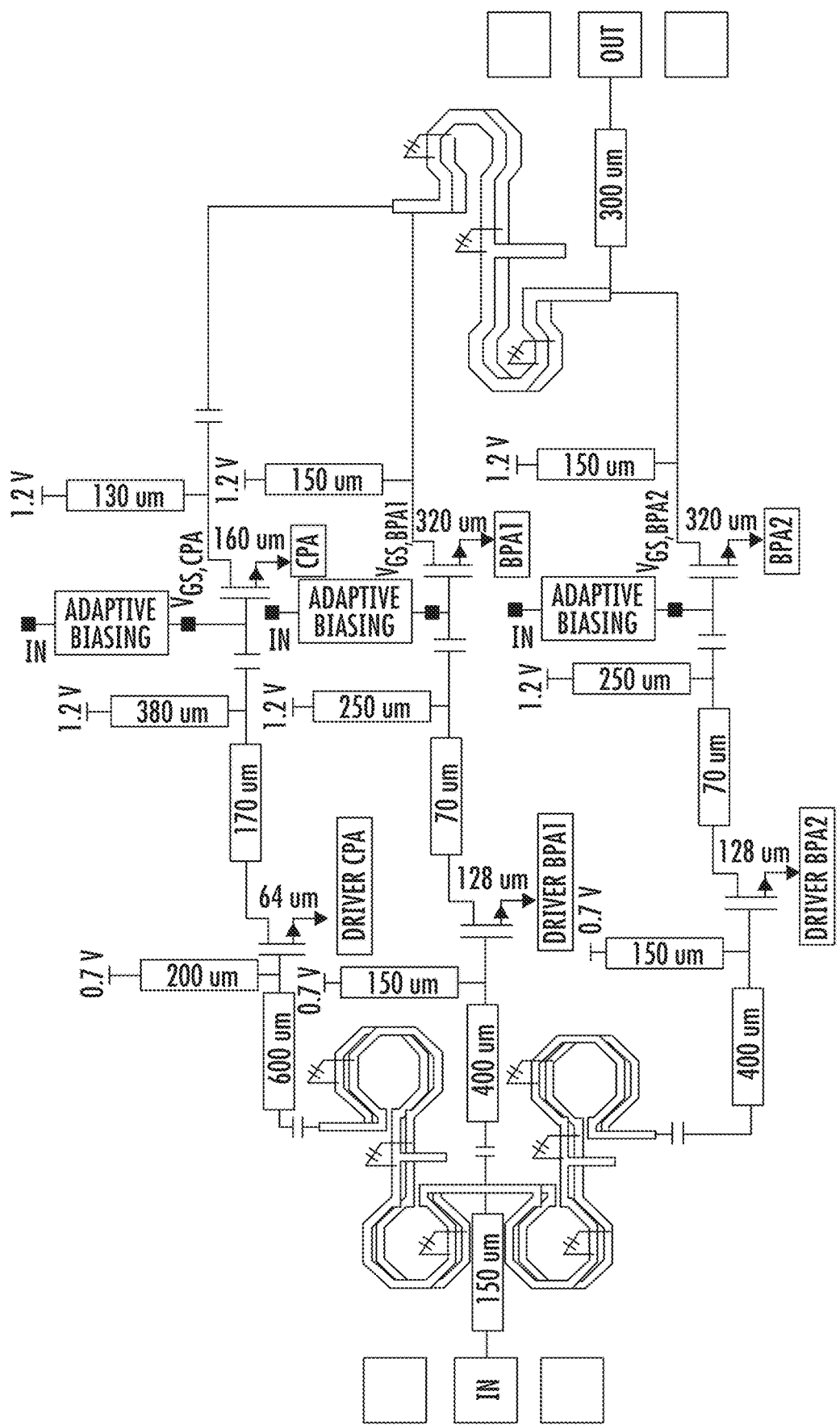
FIG. 2 is a schematic diagram Load Modulated Balanced Amplifier (LMBA) circuit with two input transformer-based hybrid circuits as an input splitter circuit feeding two balanced power amplifiers and a control PA (CPA) with interstage match, driver amplifiers and adaptive bias control and a transformer based hybrid circuit used as a combiner circuit at the output in some embodiments according to the present invention.

FIG. 2 is a schematic diagram Load Modulated Balanced Amplifier (LMBA) circuit 100 with two input transformer-based hybrid circuits as an input splitter circuit 105 feeding two balanced power amplifiers and a control PA (CPA) with interstage match, driver amplifiers and adaptive bias control and a transformer-based hybrid circuit used as the combiner circuit 110 at the output OUT in some embodiments according to the present invention. The first split input signal is provided to an input of a driver device DRIVER CPA, which drives the gate terminal of a power amplifier device CPA to provide an output that is coupled to a first input to the combiner circuit 110. The second split input signal is provided to an input of a driver device DRIVER BPA2, which drives the gate terminal of a power amplifier device BPA2 to provide an output that is coupled to a second input to the combiner circuit 110. The input signal (from the input pad IN) is also provided to an input of a driver device DRIVER BPA1, which drives the gate terminal of a power amplifier device BPA1 to provide an output that is coupled to the first input to the combiner circuit 110. The combiner circuit 110 combines the signals output from the power amplifier device BPA1 and the power amplifier device BPA1 with the output signal of power amplifier device BPA2 to provide the output from the LMBA circuit 100.

Figure 3:
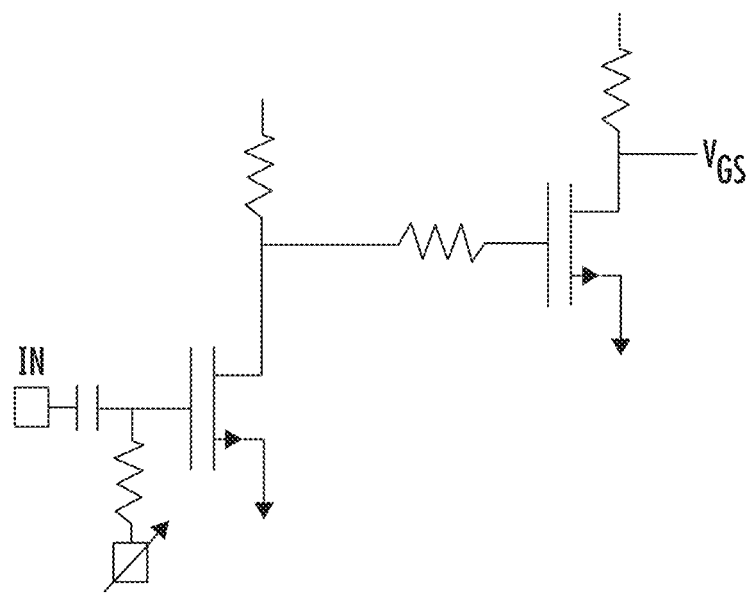
FIG. 3 is a schematic illustration of an adaptive bias control circuit used in FIG. 2 in some embodiments according to the present invention.

As further shown in FIG. 2, the gate terminals of power amplifier device BPA1, power amplifier device BPA2, and power amplifier device CPA are each coupled to a respective adaptive biasing circuit having an input that is coupled to the input signal. FIG. 3 is a schematic illustration of an example of an adaptive bias control circuit that may be used in FIG. 2 in some embodiments according to the present invention.

As also shown in FIG. 2, the gate terminals are also coupled to the output of the respective driver device through a capacitor. The interconnect providing the coupling between the devices included in the LMBA circuit 100 are specified to be of a particular length as shown.

According further shown in FIG. 2, the power amplifier device CPA is sized at ½ the size of the BPA1 and BPA2 to allow a load-modulation enhancement at 4.0 dB PBO under full injection. In some embodiments according to the invention, three transformer-based hybrid circuits are used as show in FIG. 2: two to form the input splitter circuit 105 and one as combiner circuit 110 at the output. Each of the transformer-based hybrid circuits can include a primary coil and a secondary coil that are wirelessly coupled to one another during operation. In particular, the primary and secondary coils are vertically spaced apart from one another by a gap and are offset laterally to partially overlap one another. The primary and secondary coils each also can include multiple sections (or loops) that are laterally spaced apart and connected by a conductor that forms part of the respective coil. In some embodiments according to the invention, the primary coil is located over, and is laterally offset from, the secondary coil. The input signal from the input pad IN can be coupled to the primary coil and the split input signal (i.e., the first or second split input signal) is coupled to the secondary coil, which is coupled to the gate of the respective driver device, as shown in FIG. 2. As shown in FIG. 2, capacitors are coupled between the primary and secondary coils. Although three capacitors are shown fewer or more capacitors may be used in some embodiments according to the invention.

Figure 4:
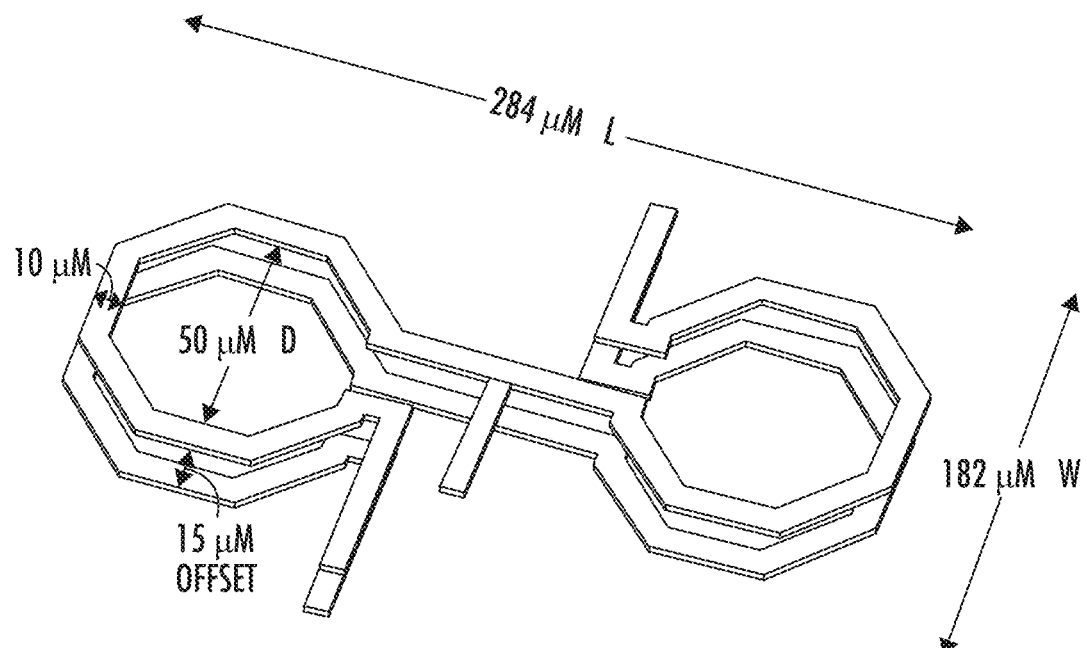
FIG. 4 is a schematic illustration of a layout of an on-chip transformer based hybrid circuit shown in FIG. 2 having example dimension selected for operations of the circuit in FIG. 2 from 30-40 GHz in some embodiments according to the present invention.

FIG. 4 is a schematic illustration of a layout of an on-chip transformer based hybrid circuit 400 shown in FIG. 2 having example dimension selected for operations of the circuit in FIG. 2 from 30-40 GHz in some embodiments according to the present invention. According to FIG. 4, the length L of the circuit 400 can be about 284 um, the width W of a loop in the circuit 400 can be about 182 um, the inner diameter D of the loop in the circuit 400 can be about 50 um, the lateral offset between the primary coil 405 and the secondary coil 410 can be about 15 um, and a thickness of a planar trace conductor on the semiconductor die can be about 10 um. It will be understood that the dimensions described above are an example only and other dimensions may be used in some embodiments. In some embodiments according to the invention, the dimensions of the on-chip transformer based hybrid circuit 400 can be selected to configure the LMBA circuit 100 to operate in the desired frequency range. In some embodiments according to the invention, the length L of the circuit 400 can be less than about 290 um, the width W of a loop in the circuit 400 can be less than about 182 um, the inner diameter D of the loop in the circuit 400 can be less than about 50 um, the lateral offset between the primary coil 405 and the secondary coil 410 can be less than about 15 um, and a thickness of a planar trace conductor on the semiconductor die can be less than about 10 um.

Figure 5:
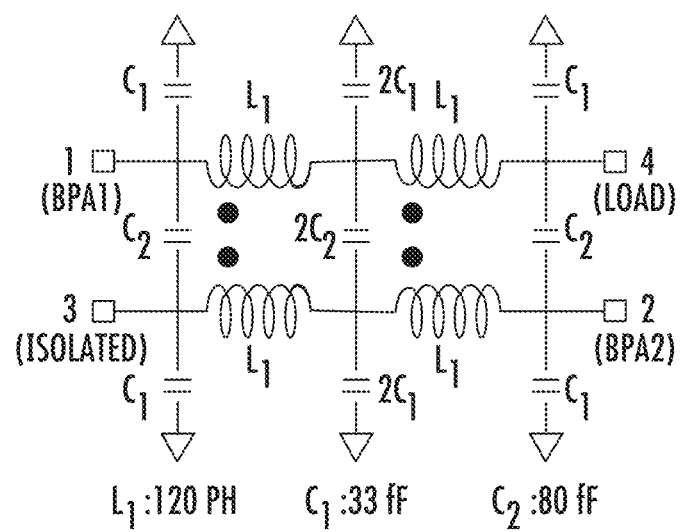
FIG. 5 is schematic illustration of a lumped equivalent circuit of the implementation of the Load Modulated Balanced Amplifier (LMBA) circuit of FIG. 2 including capacitors having values selected for operations of the circuit of FIG. 2 from 30-40 GHz in some embodiments according to the present invention.
Figure 6:
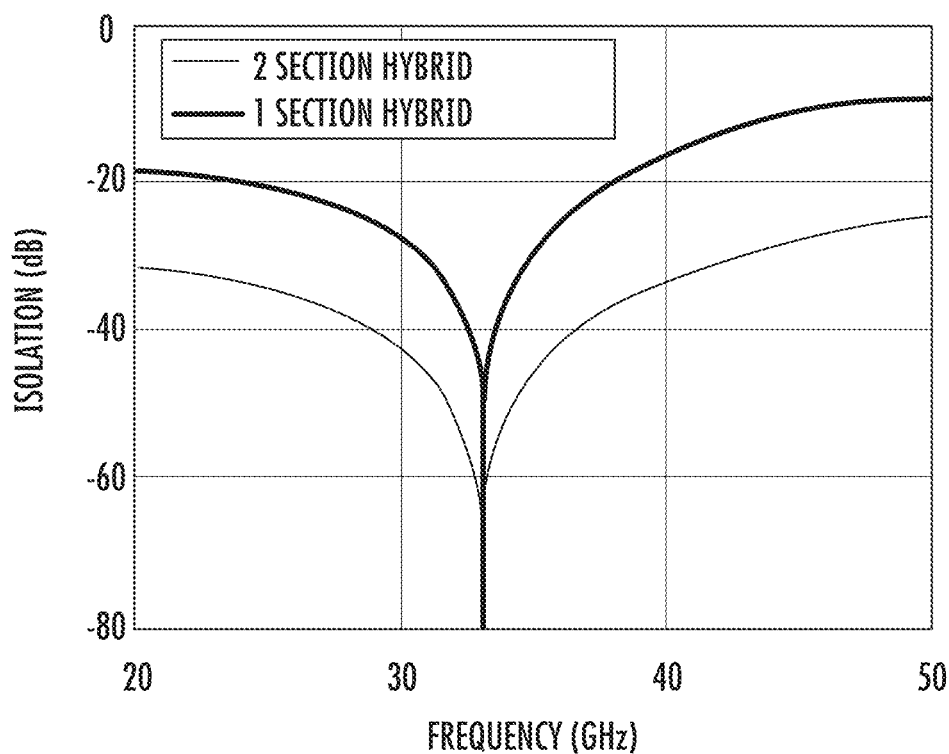
FIG. 6 is a graph illustrating simulated isolation for operation of the circuit in FIG. 2 operating from 30-40 GHz with the component values illustrated in FIG. 5 in some embodiments according to the present invention.
Figure 7:
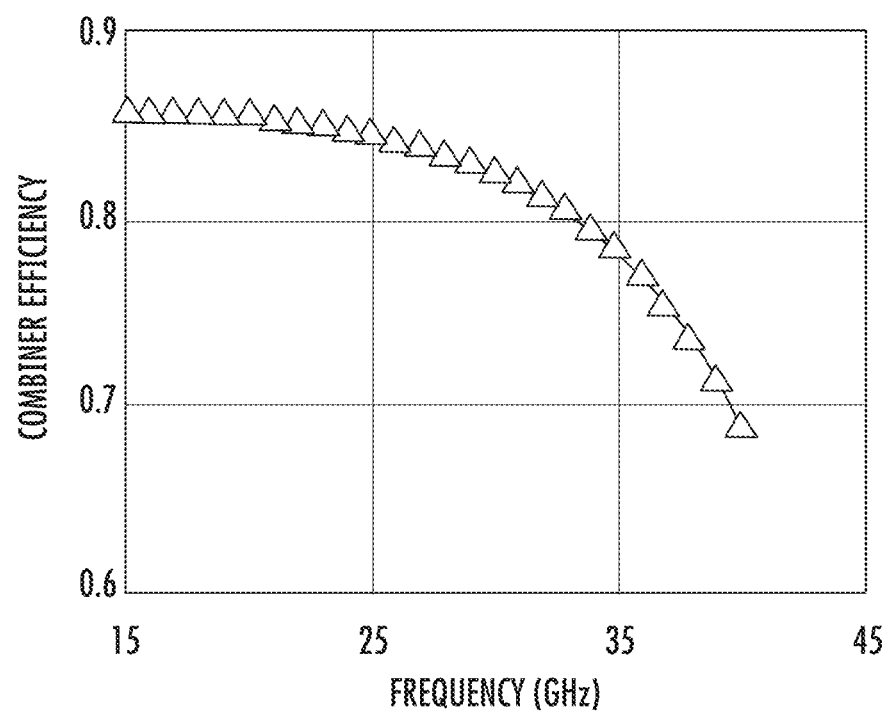
FIGS. 7 and 8 are graphs illustrating simulated combiner efficiency and isolation, respectively, for operation of the transformer-based hybrid layout in FIG. 4 operating from 30-40 GHz with the component values illustrated in FIG. 5 in some embodiments according to the present invention.
Figure 8:
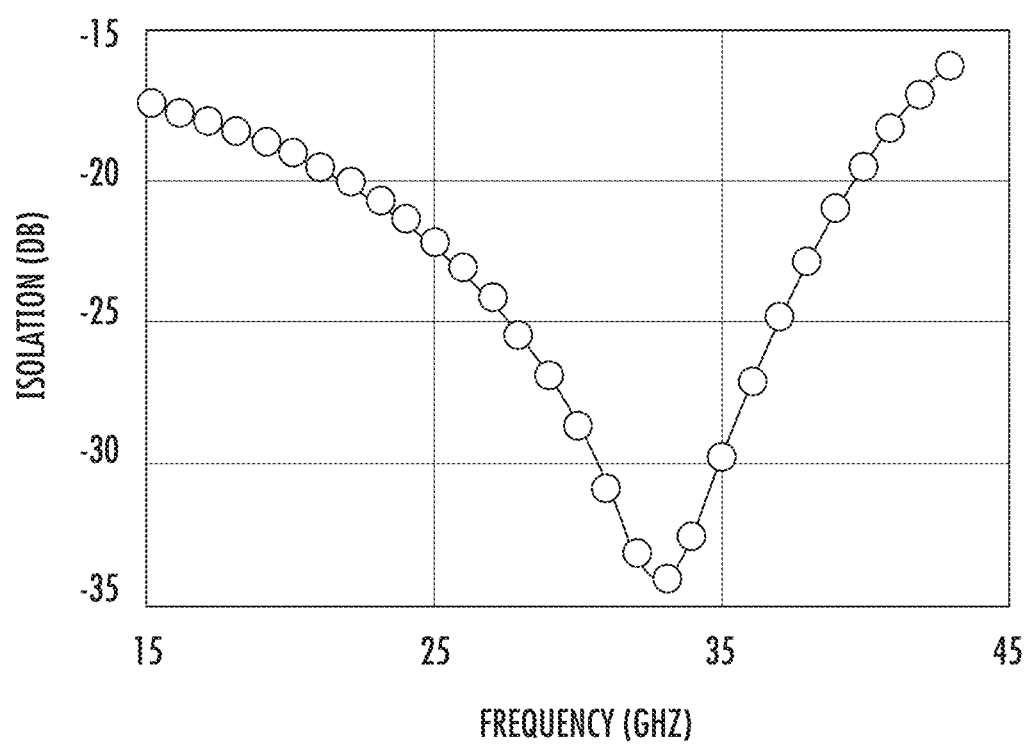

The lumped equivalent model for transformer-based hybrid of FIG. 4 is shown in FIG. 5 and can be used as a design starting point. To improve isolation at the injection CPA port, a second-order hybrid is implemented that improves isolation by around 15 dB as shown in FIG. 6. FIGS. 7 and 8 are graphs illustrating simulated combiner efficiency and isolation, respectively, for operation of the transformer-based hybrid layout in FIG. 4 operating from 30-40 GHz with the component values illustrated in FIG. 5 in some embodiments according to the present invention. It will be understood, therefore, in some embodiments according to the invention, the splitter and/or combiner of FIGS. 2 and 4 may be implemented by a discrete circuit including elements based on the lumped equivalent model for a transformer-based hybrid as illustrated, for example, in FIG. 5. In still further embodiments according to the invention, the splitter and/or combiner of FIGS. 2 and 4 may be replaced with a phase compensation network circuit to allow operation other than in quadrature.

Secondly, mutual coupling and capacitance between the transformers (with 1:1 turn ratio) are optimized for wideband impedance transformation and to ensure high isolation (>20 dB) and combining efficiency (~70-80%) across 30-40 GHz as shown in FIG. 2. Likewise, the input (RF) signal is divided into the BPA and CPA branches respectively using a hybrid that is designed to simultaneously maintain the desired power splitting ratio and the targeted phase difference for frequency reconfigurability. The structure is co-optimized with input hybrid and input matching networks. All the three branches namely, BPA1, BPA2 and CPA (active size half of BPA1/2) have pre-driver with wideband inter-stage network and an adaptive biasing circuitry in order to balance between efficiency enhancement and linearity degradation.

Figure 9:
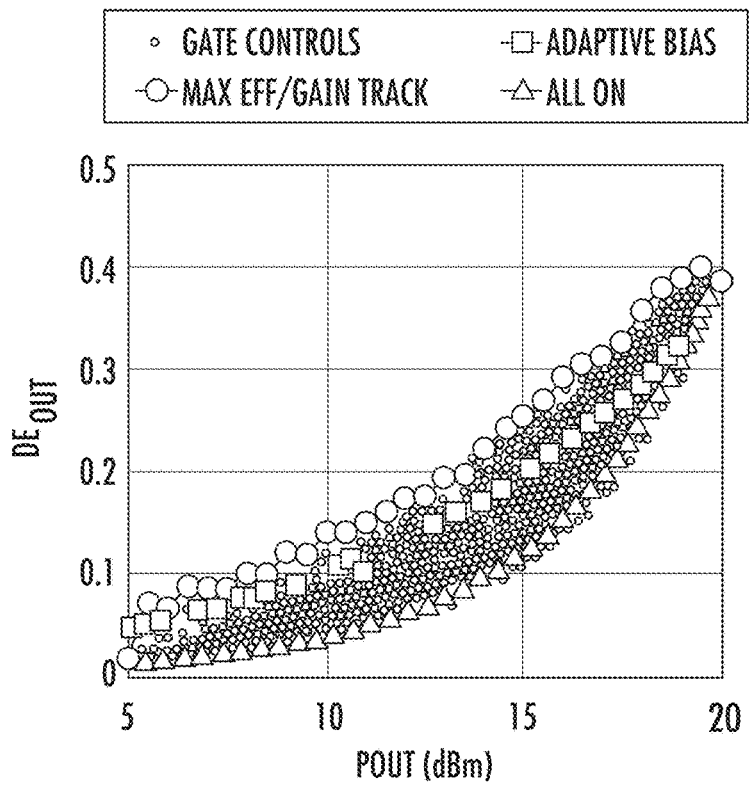
FIGS. 9 and 10 are graphs showing measured output drain efficiency (DEout) and gain versus output power at 33 GHz, respectively, for all bias controls wherein tracking maximum peak efficiency causes soft compressed AM/AM with high Psat–P1 dB(=4 dB) which can be improved by adaptive biasing allowing Psat–P1 dB=1.5 dB enhancing the linear operating range in some embodiments according to the present invention.
Figure 10:
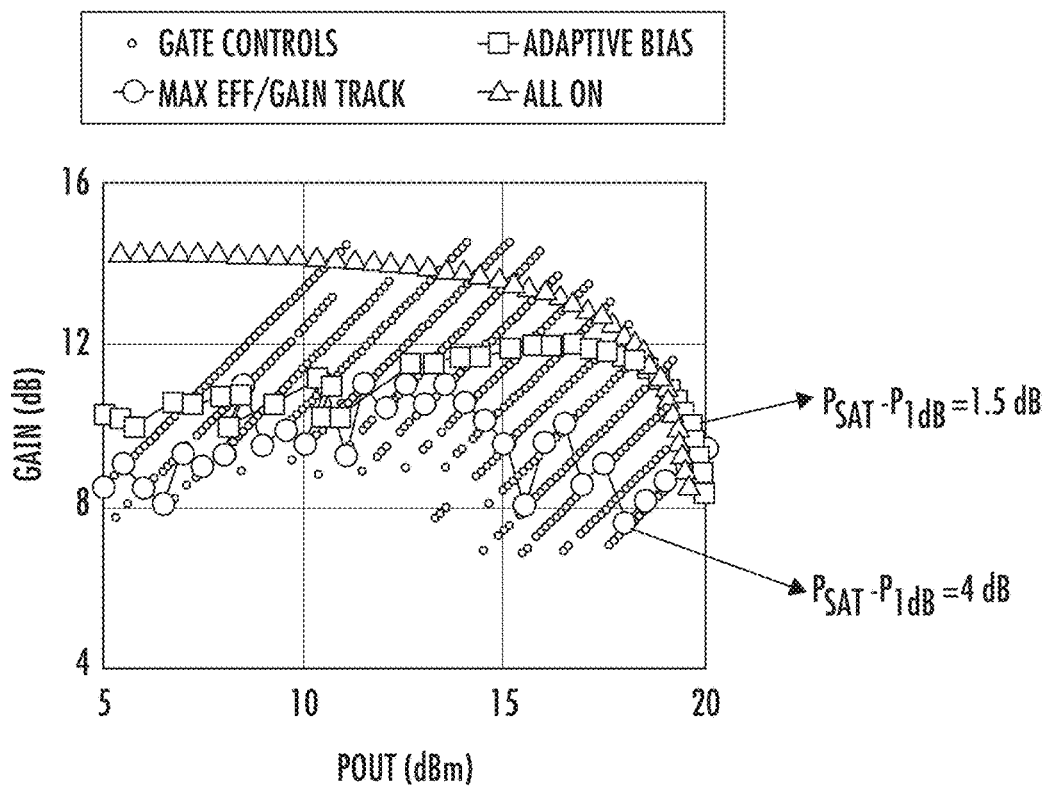

FIGS. 9 and 10 are graphs showing measured output drain efficiency (DEout) and gain versus output power at 33 GHz, respectively, for all bias controls wherein tracking maximum peak efficiency causes soft compressed AM/AM with high Psat−P1 dB(=4 dB) which can be improved by adaptive biasing allowing Psat−P1 dB=1.5 dB enhancing the linear operating range in some embodiments according to the present invention. The input gate controls for BPA (Vgs, BPA1,Vgs,BPA2) and CPA (Vgs,CPA) are swept for different input power levels which can be tracked using an embedded adaptive bias circuitry. FIGS. 9 and 10 demonstrate the trade-off in performance wherein AM/AM flatness or linearity is avoided in order to maximize efficiency over power levels. The non-monotonic and soft compressed gain behavior directly impacts the ACLR and EVM particularly for a high peak-to-average power ratio (PAPR) modulation scheme such as 64-QAM OFDM. Thus, to balance between linearity and back-off efficiency trade-off, an adaptive biasing objective function is selected such that efficiency is minimally sacrificed with significant AM/AM improvement. This can be seen at the gain compression behavior wherein improvement of 2.5 dB can be achieved i.e. from 4 dB to 1.5 dB for ΔP=Psat−P1 dB as reported in FIGS. 9 and 10.

Figure 11:
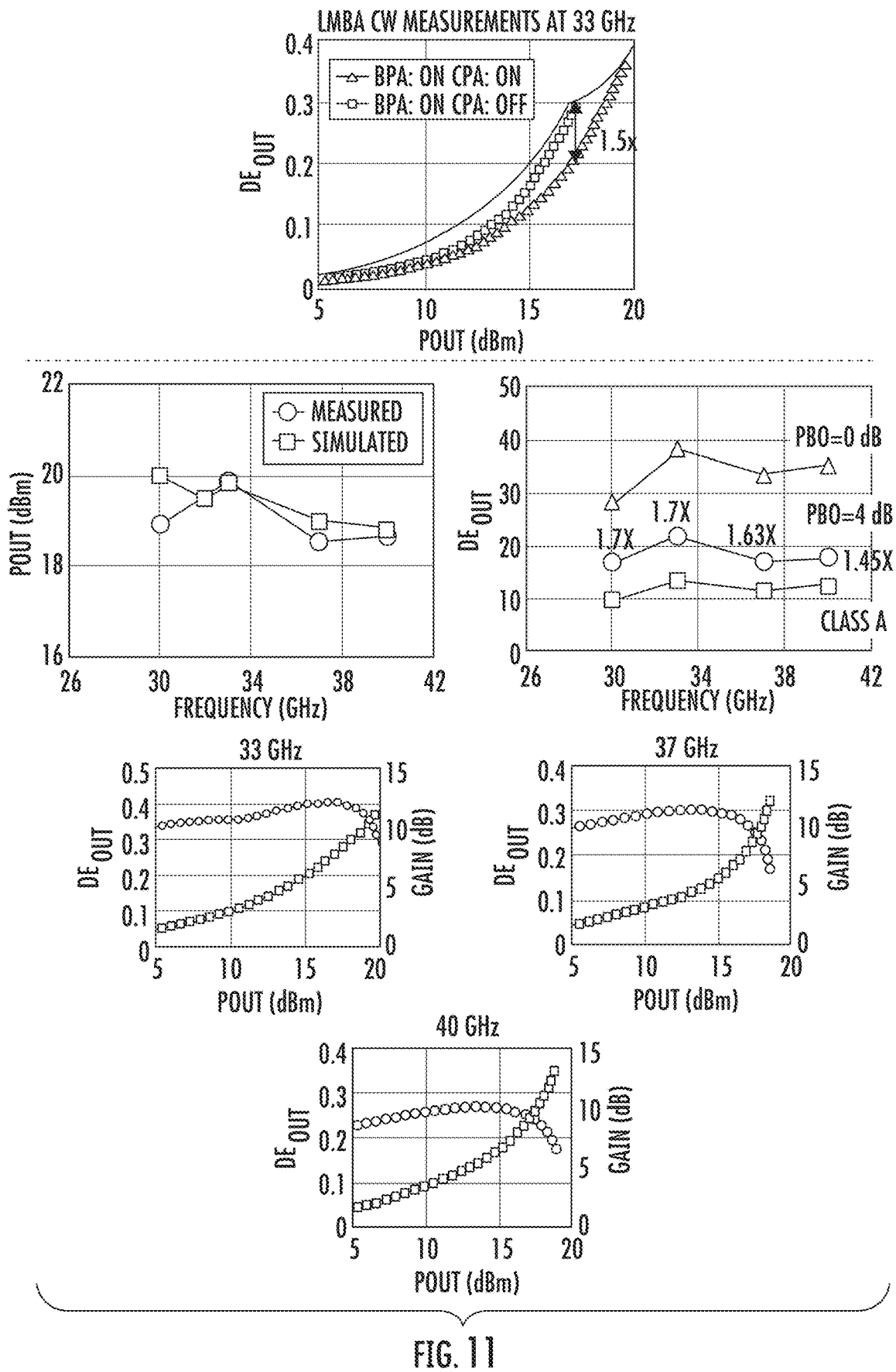
FIG. 11 are graphs showing continuous-wave measurement across 30-40 GHz where a load modulation effect is demonstrated in measurement by turning on and off the CPA showing efficiency enhancement at back-off including the measured s parameters S11 and S21 across frequencies along with large signal CW sweeps at 33/37/40 GHz showing that the PA delivers 18.5-20 dBm output power showing agreement in simulation and measurements and the output drain efficiency at PBO of 0 dB/4 dB from 30-40 GHz showing 1.5-1.75× improvement over Class A PA in some embodiments according to the present invention.
Figure 12:
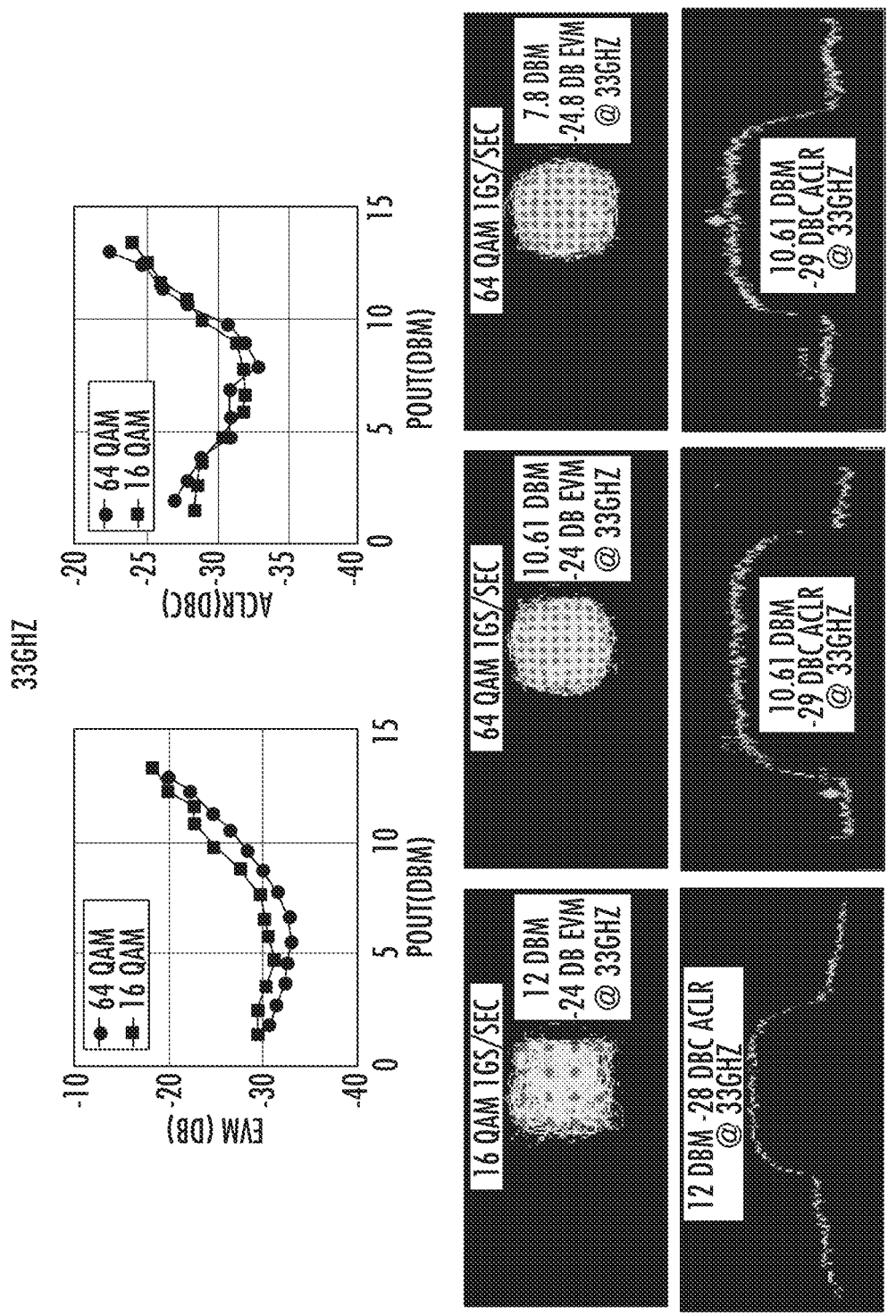
FIG. 12 shows measured EVM and ACLR as a function of average output power for a 16/64 QAM signal at 33 GHz along with measurements using 16/64 QAM (4 Gb/s, 6 Gb/s) signal demonstrating EVM of –26.4 dB at an average output power of 10.61 dBm with uncorrected ACLR of –29 dBc and average efficiency of 12.1% in some embodiments according to the present invention.

FIG. 11 includes graphs showing continuous-wave measurement across 30-40 GHz where a load modulation effect is demonstrated in measurement in some embodiments according to the present invention. As shown in FIG. 11 the, PA shows load modulation with a 1.5× enhancement in back-off efficiency. The measured CW performance is shown at 33/37/40 GHz and the PA delivers saturated output power from 18.5-20 dBm across 30-40 GHz. The output drain efficiency (DEout) across the band is reported in FIG. 11 for PBO of 0 dB with DEout ranging from 30-38% with a maximum of 38% at 33 GHz. Since the CPA is half in size of BPA1/2, the DEout is reported at 4 dB PBO. The back-off efficiency shows an enhanced from 1.4×-1.8× across the band as compared to Class A amplifiers. The modulated PA performance is evaluated using 16/64 QAM OFDM modulation with 1GS/s at 33 GHz (FIG. 12). EVM and ACLR are shown under different power levels. The PA exhibits an EVM of −26.4 dB and ACLR of −29 dBc at Pavg of 10.6 dBm and average efficiency of 12.1%.

FIG. 12 shows measured EVM and ACLR as a function of average output power for a 16/64 QAM signal at 33 GHz along with measurements using 16/64 QAM (4 Gb/s, 6 Gb/s) signal demonstrating EVM of −26.4 dB at an average output power of 10.61 dBm with uncorrected ACLR of −29 dBc and average efficiency of 12.1% in some embodiments according to the present invention. The measured output spectrum constellations for 1GS/s and 2GS/s are also reported in FIG. 11, demonstrating wideband high capacity data rate of up to 12 Gbps.

Figure 14:
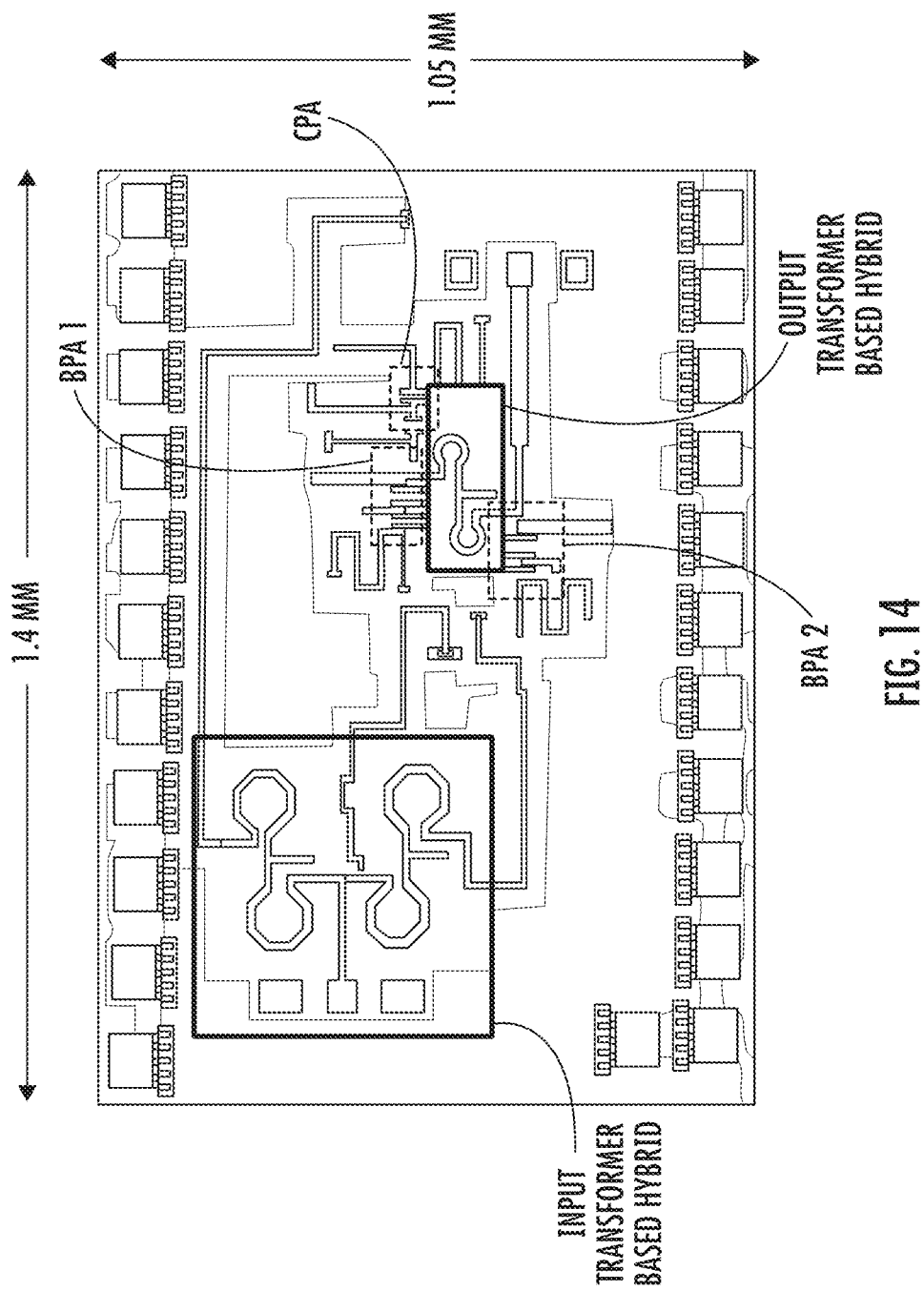
FIG. 14 is an image of an example fabricated LMBA device occupying an area of 1.47 mm² on a semiconductor die.

FIG. 13 is a table showing the performance characteristics of an example embodiment according to the invention table in comparison to conventional fully integrated RFin–RFout mmWave silicon PAs. FIG. 14 is an image of an example fabricated LMBA device occupying an area of 1.47 mm$^2$ on a semiconductor die.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the various embodiments described herein. As used herein, the term "and/or" includes any and all combinations of one or more of the associated listed items.

The terminology used herein is for the purpose of describing particular embodiments only and is not intended to be limiting to other embodiments. As used herein, the singular forms "a", "an" and "the" are intended to include the plural forms as well, unless the context clearly indicates otherwise. It will be further understood that the terms "comprises," "comprising," "includes" and/or "including", "have" and/or "having" when used herein, specify the presence of stated features, integers, steps, operations, elements, and/or components, but do not preclude the presence or addition of one or more other features, integers, steps, operations, elements, components, and/or groups thereof. Elements described as being "to" perform functions, acts and/or operations may be configured to or other structured to do so.

Unless otherwise defined, all terms (including technical and scientific terms) used herein have the same meaning as commonly understood by one of ordinary skill in the art to which various embodiments described herein belong. It will be further understood that terms used herein should be interpreted as having a meaning that is consistent with their meaning in the context of this specification and the relevant art and will not be interpreted in an idealized or overly formal sense unless expressly so defined herein.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall support claims to any such combination or subcombination.

What is claimed:

1. A load modulated balanced amplifier (LMBA) circuit, comprising:
   an input pad of the LMBA circuit configured to receive an input signal on a semiconductor die;
   a transformer-based hybrid splitter coupled to the input pad and configured to provide a first split input signal and a second split input signal from the input signal;
   a control power amplifier circuit coupled the first split input signal; and
   a power amplifier circuit coupled to the second split input signal.

2. The LMBA circuit of claim 1 wherein the transformer-based hybrid splitter circuit comprises:
   a first primary coil coupled to the input pad, the first primary coil including first and second loop sections laterally spaced apart from one another on the semiconductor die;
   a first secondary coil, vertically spaced apart from the first primary coil to form a gap therebetween configured to inductively couple to the first primary coil to provide the first split input signal; and
   a second primary coil coupled to the input pad, the second primary coil including first and second loop sections laterally spaced apart from one another on the semiconductor die;
   a second secondary coil, vertically spaced apart from the second primary coil to form a gap therebetween configured to inductively couple to the second primary coil to provide the second split input signal.

3. The LMBA circuit of claim 2 wherein:
   the first primary coil extends for a length of less than about 290 um on the semiconductor die;
   the first primary coil extends for a width of less than about 190 um on the semiconductor die;
   the first and second loop sections each have an interior diameter of less than about 50 um; and
   the first primary coil is formed by a planar conductor having a width of less than about 10 um shaped to form the first and second loop sections.

4. The LMBA circuit of claim 2 wherein:
   the first primary coil extends for a length of about 290 um on the semiconductor die;
   the first primary coil extends for a width of about 190 um on the semiconductor die;
   the first and second loop sections each have an interior diameter of about 50 um; and
   the first primary coil is formed by a planar conductor having a width of about 10 um shaped to form the and second loop sections.

5. The LMBA circuit of claim 2 wherein the transformer-based hybrid splitter circuit comprises:
   a primary coil coupled to the input pad, the primary coil including first and second loop sections laterally spaced apart from one another on the semiconductor die; and
   a secondary coil, vertically spaced apart from the primary coil to form a gap therebetween configured to inductively couple to the primary coil to provide the first split input signal, wherein the primary coil is laterally spaced apart from the secondary coil by about 15 um.

6. The LMBA circuit of claim 2 wherein the first primary coil extends for a length L, a width W, and provides an interior diameter for each of the first and second loop sections of D, and a planar conductor width selected to provide operation of the LMBA circuit in a particular frequency range.

7. The LMBA circuit of claim 2 further comprising:
   at least one capacitor device capacitively coupling the first primary coil to the first secondary coil; and
   at least one capacitor device capacitively coupling the second primary coil to the second secondary coil.

8. The LMBA circuit of claim 1 wherein the power amplifier circuit comprises a first power amplifier circuit providing a first power amplifier output signal, the LMBA circuit further comprising:
   a second power amplifier circuit having an input coupled to the input signal and providing a second power amplifier output signal;
   a transformer-based hybrid combiner circuit providing an output signal coupled to an output pad and to the first power amplifier output signal, the transformer-based hybrid combiner circuit further providing an input coupled to an output of the control power amplifier circuit and to the second power amplifier output signal.

9. The LMBA circuit of claim 8 wherein:
   the first power amplifier circuit comprises a first driver circuit coupled between the second split input signal and a first power amplifier device configured to provide the first power amplifier output signal;
   the second power amplifier circuit comprises a second driver circuit coupled between the input signal and a second power amplifier device configured to provide the second power amplifier output signal; and
   the control power amplifier circuit comprises a third driver circuit coupled between the first split input signal and a control power amplifier device configured to provide the output of the control power amplifier circuit.

10. The LMBA circuit of claim 9 further comprising:
    a first adaptive bias circuit coupled to a gate of the first power amplifier device;
    a second adaptive bias circuit coupled to a gate of the second power amplifier device; and a third adaptive bias circuit coupled to a gate of the control power amplifier device.

11. The LMBA circuit of claim 10 further comprising:
a DC blocking capacitor device coupled to the gate of the first power amplifier device.

12. A load modulated balanced amplifier (LMBA) circuit, comprising:
an on-die transformer-based hybrid splitter circuit configured to provide split input signals to an input of a balanced power amplifier (BPA) circuit including first and second power amplifier circuits and a control power amplifier circuit; and
an on-die transformer-based hybrid combiner circuit configured to combine outputs of the BPA circuit and the control power amplifier circuit with the output of the second power amplifier circuit.

* * * * *